United States Patent
Bhaskara et al.

(10) Patent No.: US 10,162,908 B1
(45) Date of Patent: Dec. 25, 2018

(54) SYSTEMS AND METHODS FOR EXTRACTING BOUNDING PLANES OF SOLID MODELS

(71) Applicant: The Boeing Company, Huntington Beach, CA (US)

(72) Inventors: Sreeram Bhaskara, Redmond, WA (US); David Arthur Patch, Kent, WA (US)

(73) Assignee: The Boeing Company, Chicago, IL (US)

( * ) Notice: Subject to any disclaimer, the term of this patent is extended or adjusted under 35 U.S.C. 154(b) by 1083 days.

(21) Appl. No.: 14/532,834

(22) Filed: Nov. 4, 2014

(51) Int. Cl.
*G06F 17/50* (2006.01)

(52) U.S. Cl.
CPC .................................. *G06F 17/50* (2013.01)

(58) Field of Classification Search
None
See application file for complete search history.

(56) References Cited

U.S. PATENT DOCUMENTS

| | | | |
|---|---|---|---|
| 6,292,197 B1 | 9/2001 | Langelaan | |
| 7,408,546 B2 | 8/2008 | Serra | |
| 7,860,290 B2 | 12/2010 | Gulsun et al. | |
| 7,932,904 B2 | 4/2011 | Branets et al. | |
| 8,532,359 B2 | 9/2013 | Takanami et al. | |
| 8,675,951 B2 | 3/2014 | van den Hengel et al. | |
| 8,699,787 B2 | 4/2014 | van den Hengel et al. | |
| 2003/0067461 A1* | 4/2003 | Fletcher | G06T 17/20 345/420 |
| 2004/0128648 A1* | 7/2004 | Rappoport | G06F 17/50 717/105 |
| 2007/0080960 A1 | 4/2007 | Dayanand et al. | |
| 2008/0043021 A1 | 2/2008 | Huang et al. | |
| 2010/0232701 A1* | 9/2010 | Mawby | G06F 17/50 382/190 |
| 2014/0253549 A1 | 9/2014 | Bachrach et al. | |
| 2015/0238290 A1* | 8/2015 | Wouters | A61C 13/0004 700/98 |

* cited by examiner

*Primary Examiner* — Craig C Dorais
(74) *Attorney, Agent, or Firm* — Armstrong Teasdale LLP

(57) ABSTRACT

A method for generating bounding planes surrounding a solid model is provided. The method is implemented by a conversion computing device including a processor coupled to a memory. The method includes receiving, by the conversion computing device, an input solid model. The method additionally includes obtaining, by the conversion computing device, a bounding box solid that encloses the input solid model. Additionally, the method includes determining, by the conversion computing device, a plurality of faces of the input solid model. Further, the method includes generating, by the conversion computing device, a plurality of bounding planes that enclose the input solid model and that do not intersect the input solid model, based at least in part on the plurality of faces. Additionally, the method includes storing, by the conversion computing device, the bounding planes in the memory.

19 Claims, 15 Drawing Sheets

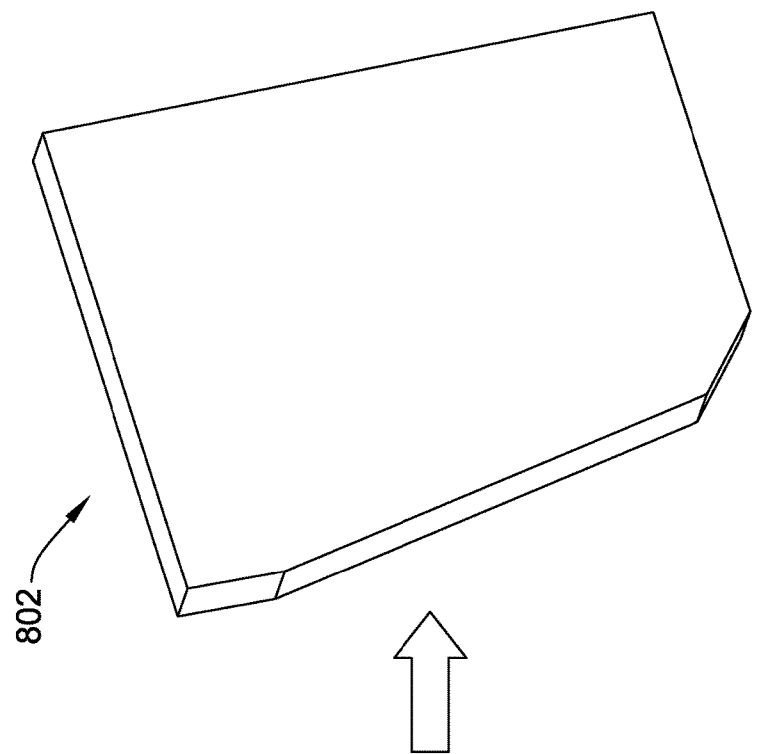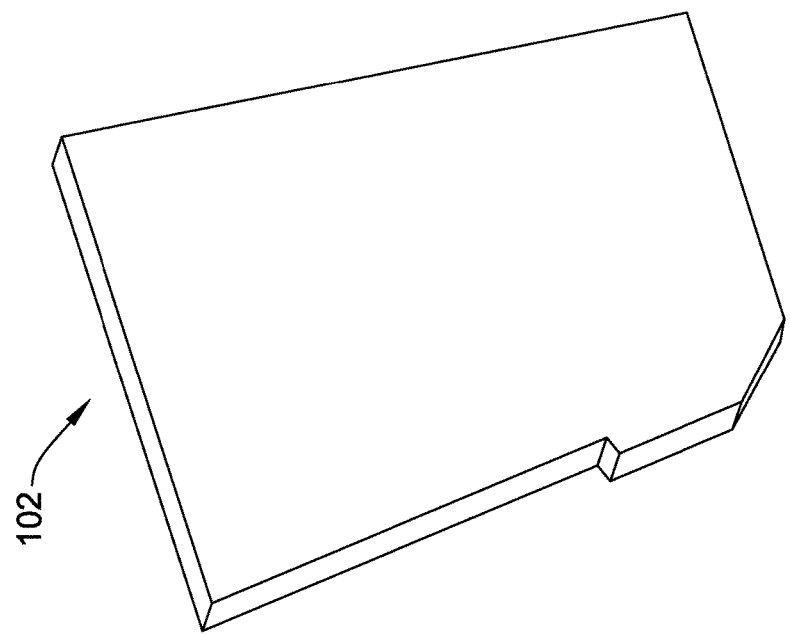
FIG. 8

SYSTEMS AND METHODS FOR EXTRACTING BOUNDING PLANES OF SOLID MODELS

BACKGROUND

The present disclosure relates generally to models used in computer aided design (CAD), and more specifically to determining bounding planes of such models.

In at least some known systems, over time, CAD models are migrated from older CAD system versions to newer versions, or from other CAD systems into a target CAD system. In many cases, this results in what are known as 'dumb' solids (i.e., a solid object that has no definition of how it was created). As a result of the migration, a user of the migrated CAD model (i.e., the 'dumb' solid) has reduced control over components of the model.

BRIEF DESCRIPTION

In one aspect, a method for generating bounding planes surrounding a solid model is provided. The method is implemented by a conversion computing device including a processor coupled to a memory. The method includes receiving, by the conversion computing device, an input solid model. The method additionally includes obtaining, by the conversion computing device, a bounding box solid that encloses the input solid model. Additionally, the method includes determining, by the conversion computing device, a plurality of faces of the input solid model. Further, the method includes generating, by the conversion computing device, a plurality of bounding planes that enclose the input solid model and that do not intersect the input solid model, based at least in part on the plurality of faces. Additionally, the method includes storing, by the conversion computing device, the bounding planes in the memory.

In another aspect, a conversion computing device for use in generating bounding planes surrounding a solid model is provided. The conversion computing device includes a processor coupled to a memory. The processor is configured to receive an input solid model, obtain a bounding box solid that encloses the input solid model, determine a plurality of faces of the input solid model, generate a plurality of bounding planes that enclose the input solid model and that do not intersect the input solid model, based at least in part on the plurality of faces, and store the bounding planes in the memory.

In another aspect, a computer-readable storage medium having computer-executable instructions embodied thereon for use in generating bounding planes surrounding a solid model is provided. When executed by a conversion computing device including a processor coupled to a memory, the computer-executable instructions cause the conversion computing device to receive an input solid model, obtain a bounding box solid that encloses the input solid model, determine a plurality of faces of the input solid model, generate a plurality of bounding planes that enclose the input solid model and that do not intersect the input solid model, based at least in part on the plurality of faces, and store the bounding planes in the memory.

BRIEF DESCRIPTION OF THE DRAWINGS

FIG. 8 is a diagram of the input solid model and a billet solid generated from the input solid model.

DETAILED DESCRIPTION

Implementations of the systems and methods described herein can be used to aid in the conversion of a 'dumb' solid (i.e., a solid object that has no definition of how it was created) into a 'normal' solid when migrating the solid (i.e., CAD model) from a first CAD system to a second CAD system. As a result, a user of the second CAD system is given full control over components of the solid, such as the definition of the solid. The systems and methods described herein facilitate creating a fully configured solid part.

The solutions presented herein provide several methods for determining the outer bounding planar surfaces of an existing input solid model. One method described herein provides a general solution for finding all of the outer bounding planar surfaces of an input solid model. A second method described herein is a "Plane Aligned Face Solution" that finds specific planar surfaces on the input solid model that are closest to some other reference surface. A third method described herein determines bounding planes for an input solid model using reference pads.

These methods and systems described herein may be applied to solving other related kinds of problems such as, clash detection analysis, defining splitting planes for creating new solids or as a reference plane while positioning other geometrical objects relative to a solid model and in many other geometric modeling techniques.

In one implementation, a computer program is provided, and the program is embodied on a computer-readable medium. In an example implementation, the computer program is executed on a single computing device, without requiring a connection to a server computer. The computer program is flexible and designed to run in various different environments without compromising any major functionality. In some implementations, the system includes multiple components distributed among a plurality of computing devices. One or more components may be in the form of computer-executable instructions embodied in a computer-readable medium. The systems and processes are not limited to the specific implementations described herein. In addition, components of each system and each process can be practiced independent and separate from other components and processes described herein. Each component and process can also be used in combination with other assembly packages and processes.

As used herein, an element or step recited in the singular and preceded with the word "a" or "an" should be understood as not excluding plural elements or steps, unless such exclusion is explicitly recited. Furthermore, references to "example implementation" or "one implementation" of the present disclosure are not intended to be interpreted as excluding the existence of additional implementations that also incorporate the recited features.

Figure 1:
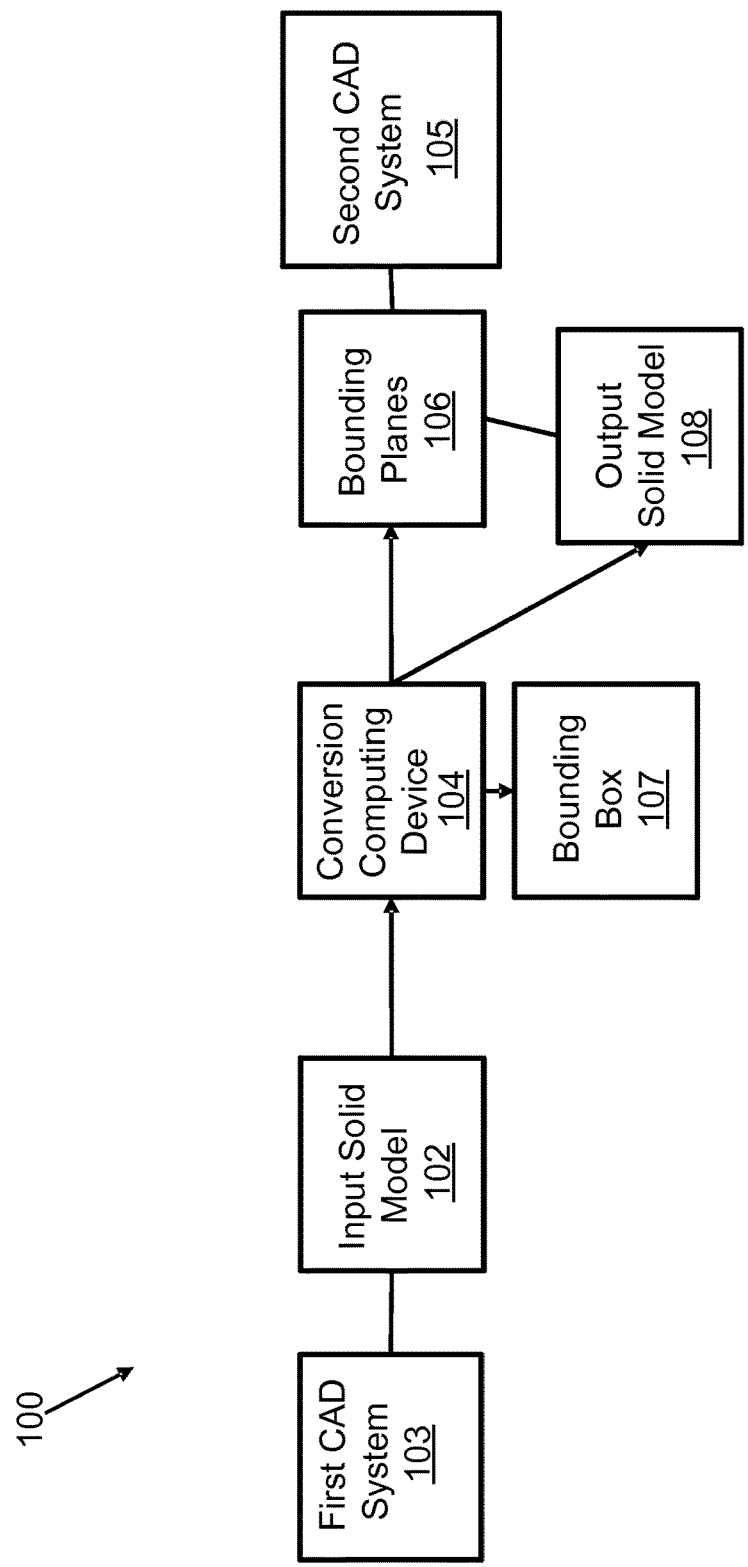
FIG. 1 is a diagram of an example environment in which a conversion computing device receives an example input solid model and generates bounding planes for the input solid model.

FIG. 1 is a diagram of an example environment 100 in which a conversion computing device 104 receives an input solid model 102 and generates bounding planes 106 for input solid model 102. Conversion computing device 104 receives input solid model 102, for example in a file or data stream. Input solid model 102 is, for example, a computer aided design (CAD) model that is being migrated from a first CAD system 103 to a second CAD system 105. Input solid model 102 does not contain information about how input solid model 102 was created and, as a result, provides a user with limited or no control over individual components of input solid model 102 in second CAD system 105. Although shown as separate, in some implementations, conversion computing device 104 is part of, or includes, one or more of first CAD system 103 and second CAD system 105. In some implementations, second CAD system 105 is an upgraded or newer version of first CAD system 103. Conversion computing device 104 converts input solid model 102 into an output file that includes a solid model 108 that provides a user with full control over output of a file that includes the solid model 108. Additionally, as described in more detail herein, conversion computing device 104 obtains at least one bounding box 107 for input solid model 102 while performing the methods described herein.

Figure 2:
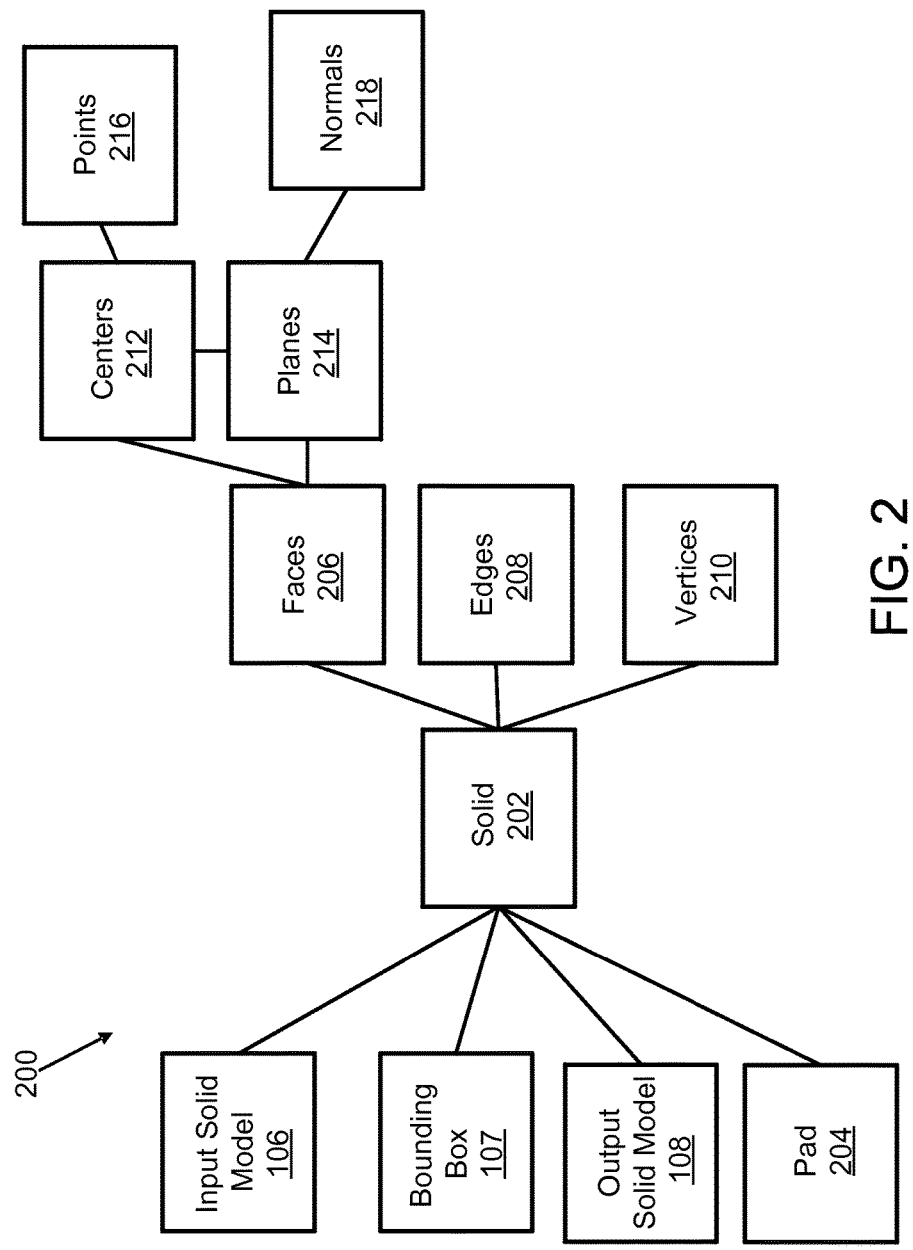
FIG. 2 is a diagram of a relationship between model components used by the conversion computing device of FIG. 1.

FIG. 2 is a diagram of a relationship 200 between model components used by conversion computing device 104. As described in more detail herein, input solid model 102, bounding box 107, output solid model 108, and a pad 204 are all examples of a solid 202, for example a CAD model. Each solid 202 includes faces 206, edges 208, and vertices 210. Each face 206 is a surface on solid 202. Each edge 208 is a bounding curve or line segment of each face 206. Vertices 210 are end points of each edge 208. Faces 206 may be non-planar (i.e., curved) or planar (i.e., flat). Implementations of the methods and systems described herein operate on faces 206 that are planar and accordingly, have a center 212 that is a point 216 located at the geometric center of the face 206. Each face 206 is based on a plane 214 and has a normal 218. A normal 218 is vector that extends perpendicularly from the plane 214 of the face 206. As will be appreciated by those skilled in the art of three dimensional modeling, a plane 214 may be defined by a point 216 and a normal 218.

Figure 3:
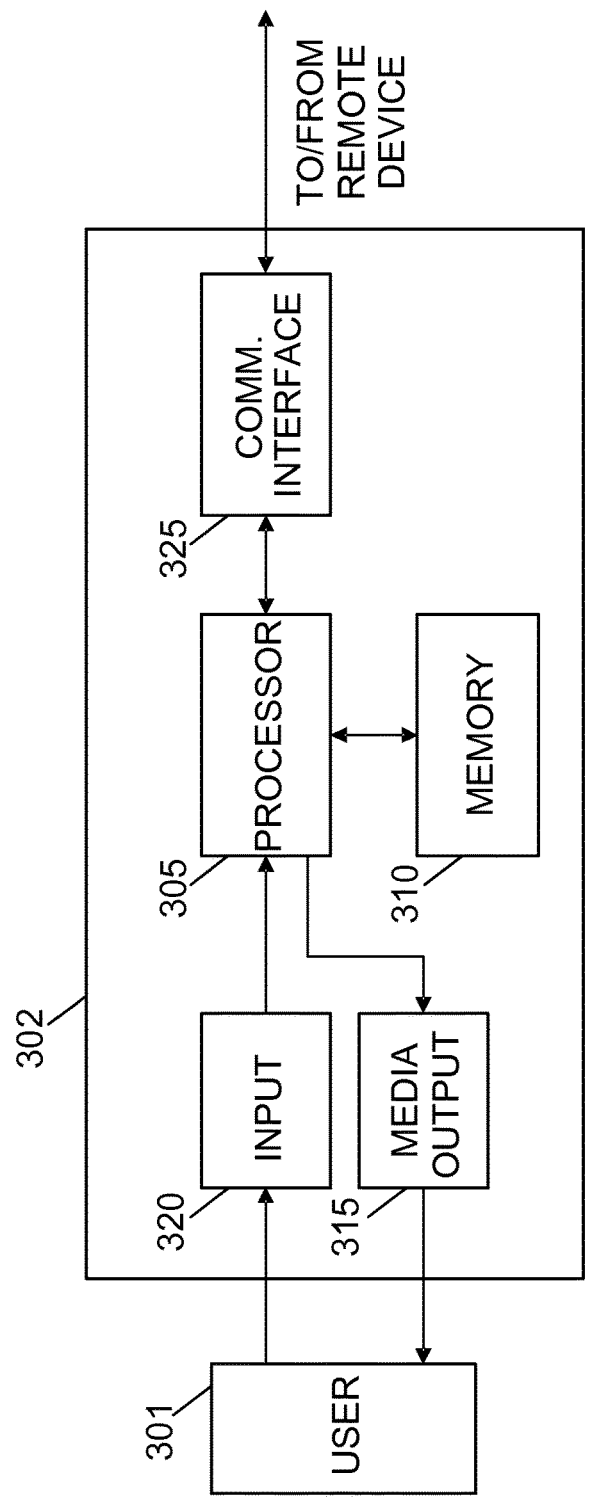
FIG. 3 is a block diagram of an example computing device used in the environment of FIG. 1.

FIG. 3 is a block diagram of an example computing device 302. Computing device 302 is representative of conversion computing device 104. More specifically, conversion computing device 104 includes one or more components of computing device 302. Computing device 302 includes at least one processor 305 for executing instructions. In some implementations, executable instructions are stored in a memory device 310. Processor 305 may include one or more processing units (e.g., in a multi-core configuration). One or more memory devices 310 are any one or more devices allowing information such as executable instructions and/or other data to be stored and retrieved. One or more memory devices 310 may include one or more computer-readable media.

Computing device 302 also includes at least one media output component 315 for presenting information to a user 301. Media output component 315 is any component capable of conveying information to user 301. In some implementations, media output component 315 includes an output adapter such as a video adapter and/or an audio adapter. An output adapter is operatively coupled to processor 305 and operatively couplable to an output device such as a display device (e.g., a liquid crystal display (LCD), organic light emitting diode (OLED) display, cathode ray tube (CRT), or "electronic ink" display) or an audio output device (e.g., a speaker or headphones). In at least some implementations, media output component 315 causes one or more of input solid model 102 and output solid model 108 to be displayed to user 301. Alternatively, the computing device 302 is configured to generate an output file that includes the output solid model having a plurality of generated bounding planes.

In some implementations, computing device 302 includes an input device 320 for receiving input from user 301. Input device 320 may include, for example, a keyboard, a pointing device, a mouse, a stylus, a touch sensitive panel (e.g., a touch pad or a touch screen), a gyroscope, an accelerometer, a position detector, or an audio input device. A single component such as a touch screen may function as both an output device of media output component 315 and input device 320.

Computing device 302 additionally includes a communication interface 325, which is communicatively couplable to a remote device such as another computing device 302. Communication interface 325 may include, for example, a wired or wireless network adapter or a wireless data transceiver for use with a mobile phone network (e.g., Global System for Mobile communications (GSM), 3G, 4G or Bluetooth) or other mobile data network (e.g., Worldwide Interoperability for Microwave Access (WIMAX)).

Stored in one or more memory devices 310 are, for example, computer-readable instructions for providing a user interface to user 301 via media output component 315 and, optionally, receiving and processing input from input device 320. A user interface may include, text, graphics, and/or sound that enable user 301 to interact with computing device 302.

Figure 4:
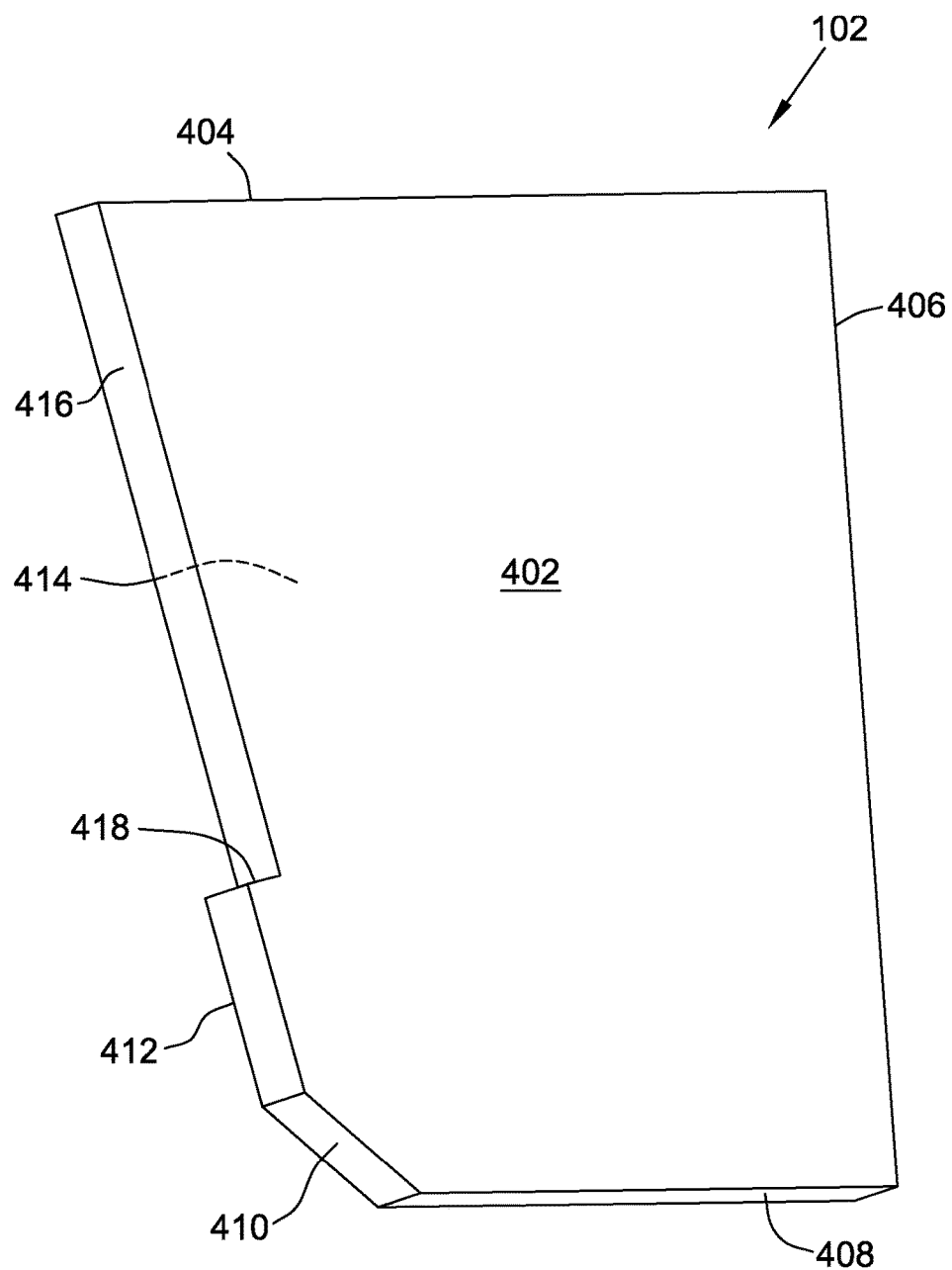
FIG. 4 is a diagram of the input solid model of FIG. 1.

FIG. 4 is a diagram of input solid model 102. Input solid model includes a first face 402, a second face 404, a third face 406, a fourth face 408, a fifth face 410, a sixth face 412, a seventh face 414, an eighth face 416, and a ninth face 418. As described in more detail herein, in at least some implementations, conversion computing device 104 determines that first face 402, second face 404, third face 406, fourth face 408, fifth face 410, sixth face 412, and seventh face 414 are outer surface faces. By contrast, eighth face 416 and ninth face 418 are intersecting faces that, if extended along their planes 214, would intersect with input solid model 102.

Figure 5:
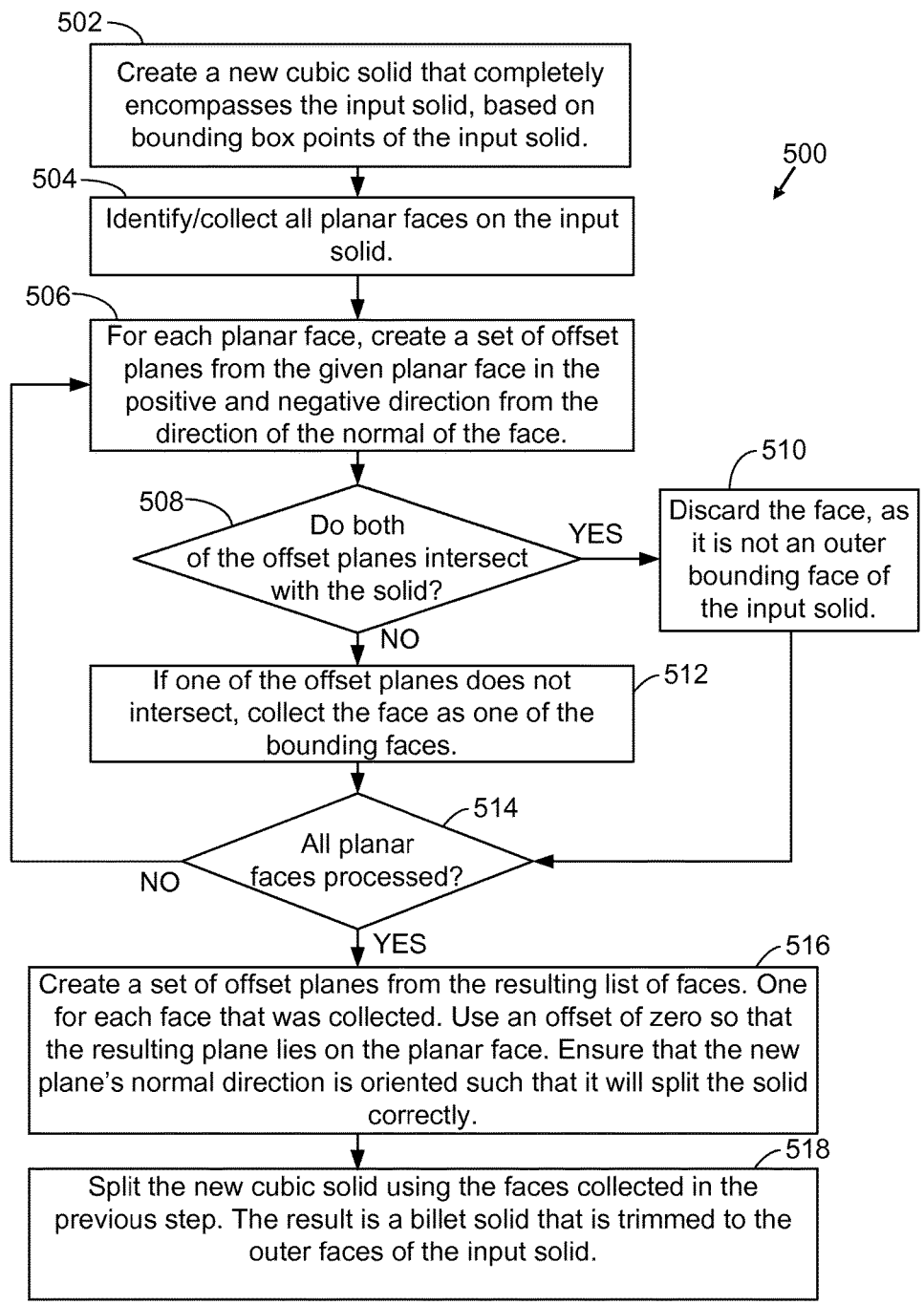
FIG. 5 is a diagram of an example process executed by the conversion computing device to determine bounding planes from the input solid model.
Figure 6:
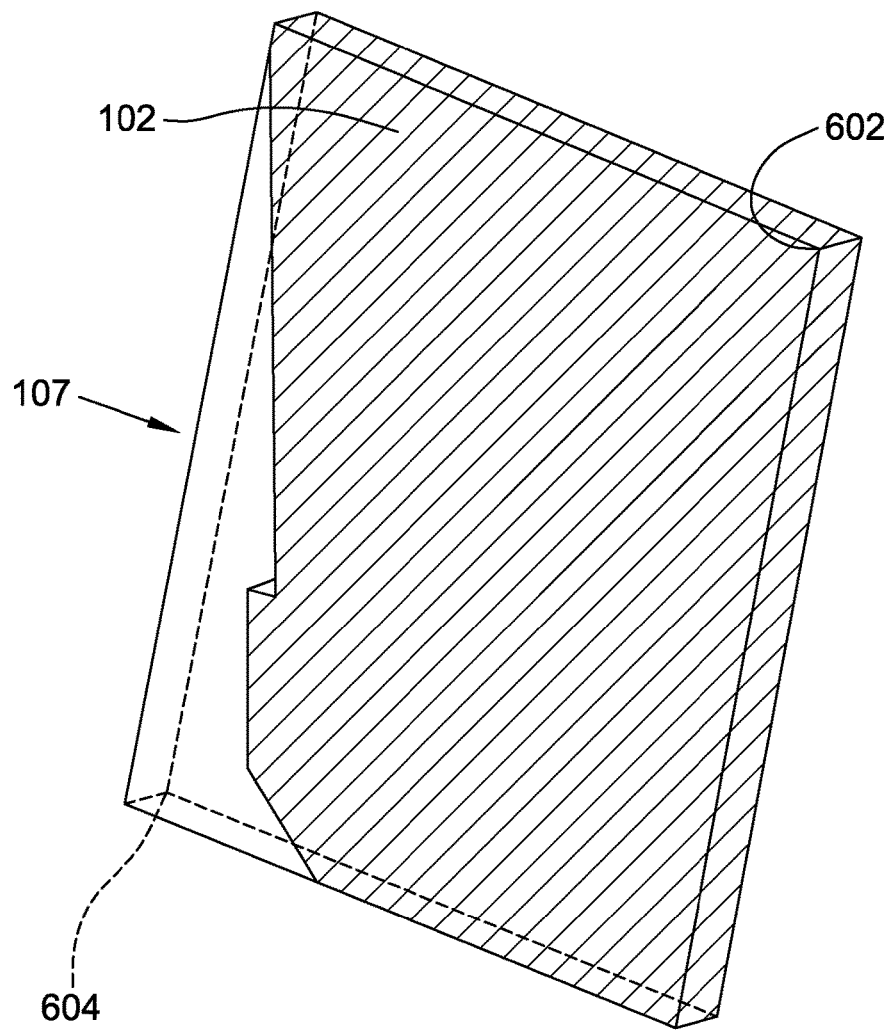
FIG. 6 is a diagram of the input solid model and a bounding box enclosing the input solid model.

FIG. 5 is a diagram of an example process 500 executed by conversion computing device 104 to determine bounding planes 106 from input solid model 102. In process 500, conversion computing device 104 determines the outer bounding planar surfaces (e.g., bounding planes 106) of the input solid (e.g., input solid model 102) to create an initial solid billet that completely encases the original solid (e.g., input solid model 102) and trims the new solid (i.e., the solid billet) to the outer bounding surfaces of the input solid. As described above, an outer bounding planar surface ("outer surface face") is one that would not intersect the parent solid (e.g., input solid model 102) if a plane were defined on the surface and an intersection between the plane and the solid was performed. FIG. 6 is a diagram of input solid model 102 and a bounding box 107 enclosing input solid model 102. Initially, conversion computing device 104 creates 502 a cubic solid (e.g., bounding box 107) that completely encompasses input solid model 102. Conversion computing device 104 creates the cubic solid (e.g., bounding box 107) based on bounding box points, including a first bounding box point 602 and a second bounding box point 604, of input solid model 102. Additionally, conversion computing device 104 identifies 504 and collects all planar faces 206 on input solid model 102. More specifically, conversion computing device 104 identifies 504 and collects first face 402, second face 404, third face 406, fourth face 408, fifth face 410, sixth face 412, seventh face 414, eighth face 416, and ninth face 418 shown in FIG. 4.

Figure 7:
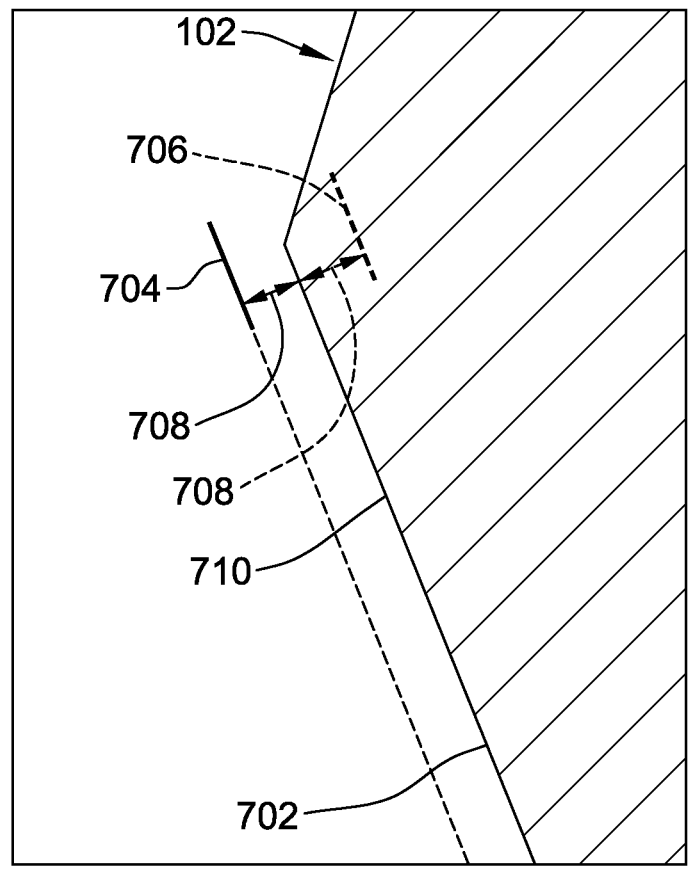
FIG. 7 is a diagram of the input solid model and offset planes created by the conversion computing device.

The next step is illustrated by FIG. 7. For each planar face 206 (i.e., first face 402, second face 404, third face 406, fourth face 408, fifth face 410, sixth face 412, seventh face 414, eighth face 416, and ninth face 418), conversion computing device 104 creates 506 a set of planes 214 offset from the given planar face 206 in a positive direction and a negative direction of the normal 218 of the face 206. More specifically, for reference face 702 of input solid model 102, conversion computing device 104 creates a first offset plane 704 offset by distance 708 in a positive direction of normal 710 and a second offset plane 706 offset by distance 708 in a negative direction of normal 710. Offset distance 708 is, for example, 0.00010 inches. Next, conversion computing device 104 determines 508 whether both of the offset planes (e.g., first offset plane 704 and second offset plane 706) intersect with input solid model 102. If conversion computing device 104 determines that both of the offset planes (e.g., first offset plane 704 and second offset plane 706) do intersect with input solid model 102, then conversion computing device 104 discards the face 206 (e.g., reference face 702), as it is not an outer bounding face of input solid model 102. However, if conversion computing device 104 determines that one of the offset planes (e.g., one of first offset plane 704 and second offset plane 706) does not intersect with input solid model 102, then conversion computing device 104 collects 512 the face 206 (e.g., reference face 702) as one of the bounding faces. Next, conversion computing device 104 determines 514 whether all of the planar faces 206 have been processed. If not, then conversion computing device 104 loops back to step 506, described above. Through the above steps, conversion computing device determines that first face 402, second face 404, third face 406, fourth face 408, fifth face 410, sixth face 412, and seventh face 414 are outer surface faces (bounding faces).

If conversion computing device 104 determines that all of the planar faces 206 have been processed, then conversion computing device 104 proceeds to create 516 a set of offset planes from the resulting list of faces (e.g., first face 402, second face 404, third face 406, fourth face 408, fifth face 410, sixth face 412, and seventh face 414). More specifically, conversion computing device 104 creates an offset plane 214 for each face 206 that was collected (e.g., first face 402, second face 404, third face 406, fourth face 408, fifth face 410, sixth face 412, and seventh face 414). However, in this step, conversion computing device 104 uses an offset distance 708 of zero so that the resulting plane 214 lies on the planar surface of the corresponding face 206 (e.g., each of first face 402, second face 404, third face 406, fourth face 408, fifth face 410, sixth face 412, and seventh face 414). Additionally, conversion computing device 104 ensures that the direction of the normal 218 of the new plane 214 is oriented such that it will split the solid (i.e., bounding box 107) correctly. The offset planes 214 generated in step 516 are the bounding planes 106 shown in FIG. 1.

The next step is described with reference to FIG. 8. Conversion computing device 104 splits 518 the new cubic solid (i.e., bounding box 107) using the faces (i.e., the offset planes having a zero offset) collected in step 516. The result is a billet solid 802 that is trimmed to the outer faces (e.g., first face 402, second face 404, third face 406, fourth face 408, fifth face 410, sixth face 412, and seventh face 414) of input solid model 102. Billet solid 802 is output solid model 108, shown in FIG. 1.

Figure 9:
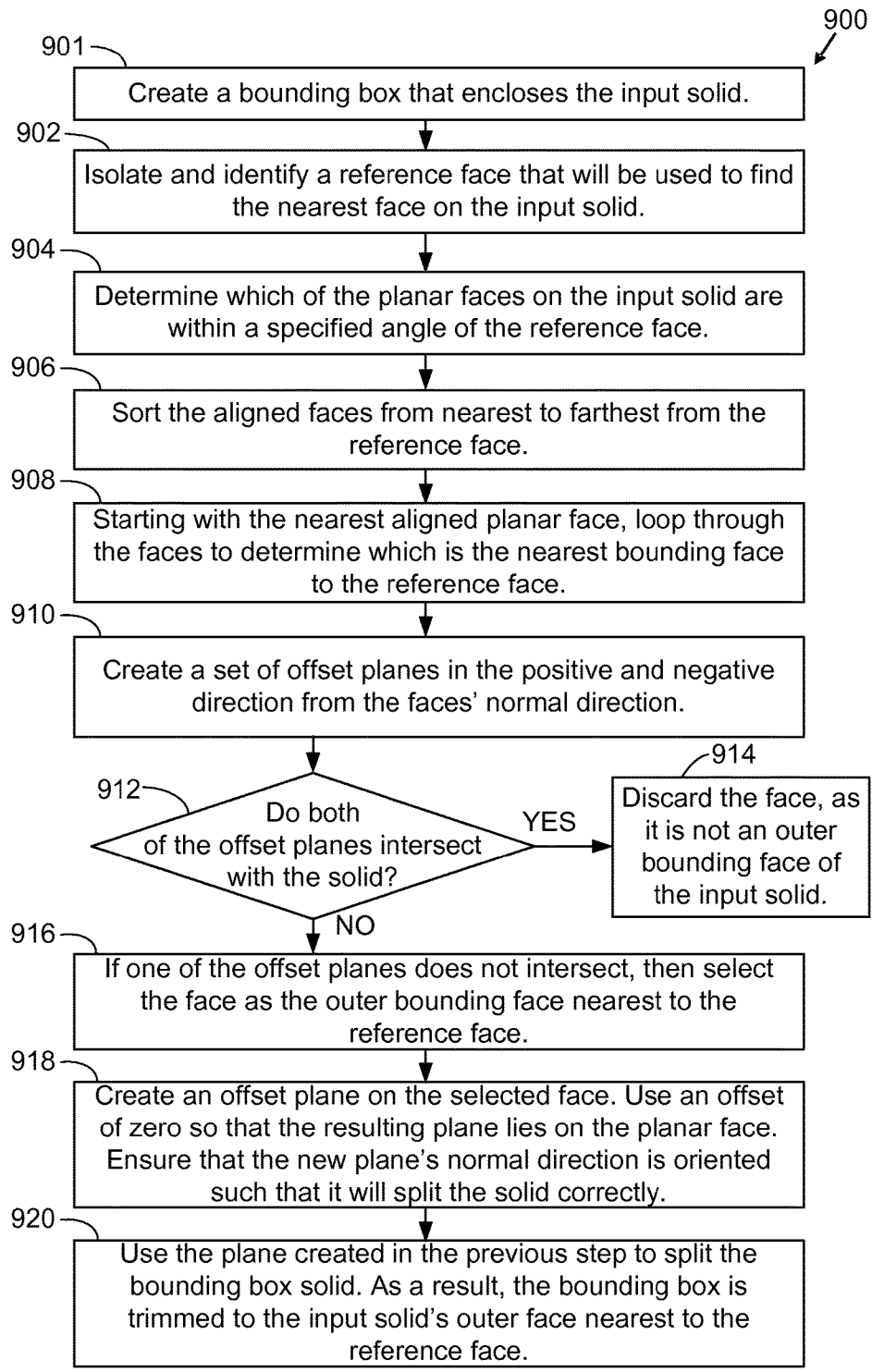
FIG. 9 is a flow chart of an example process for identifying faces on the input solid model that are nearest to corresponding reference faces of a bounding box.
Figure 10:
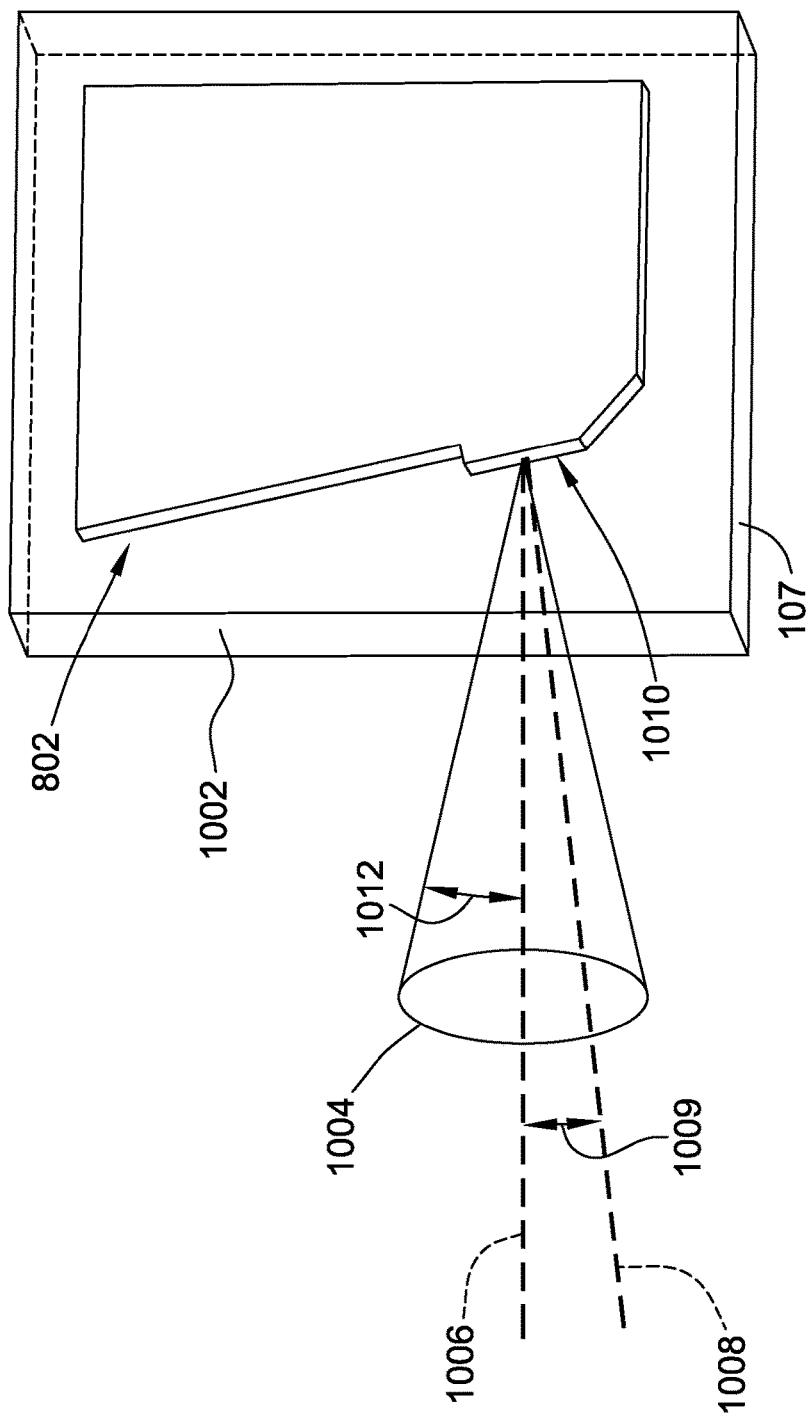
FIG. 10 is another diagram of the input solid model and a bounding box enclosing the input solid model, illustrating steps in the process shown in FIG. 9.

FIG. 9 is a flow chart of an example process 900 for identifying faces on input solid model 120 that are nearest to corresponding reference faces 206 of a bounding box 107. Process 900 provides a "plane aligned face solution". Process 900 could be used, for example, to determine the set of outer bounding faces that are nearest to the sides (faces) of a bounding box (e.g., bounding box 107). At least some implementations of process 900 are based on the assumption that the input solid model (e.g., input solid model 102) has planar faces on each of the six sides (e.g., left, right, top, bottom, front, and back). FIG. 10 is a diagram of input solid model 102 and bounding box 107 enclosing input solid model 102. Initially, conversion computing device 104 creates a new bounding box solid (e.g., bounding box 107), also referred to herein as a cubic-shaped solid, that encloses the input solid (e.g., input solid model 102). Conversion computing device 104 creates 901 bounding box 107 using bounding points (e.g., bounding points 602 and 604 of FIG. 6), which are opposing corner points that bound input solid model 102. In the following steps, for each of the faces on the bounding box solid (e.g., bounding box 107), conversion computing device 104 identifies the face 206 on the input solid (e.g., input solid model 102) that is closest to each reference face. The process 900 requires the following inputs: a) The solid (e.g., input solid model 102) on which conversion computing device 104 will find the face 206. b) A reference face of bounding box 107 from which conversion computing device 104 will find the closest face 206 of the input solid (e.g., input solid model 102). In this case, conversion computing device 104 will use each of the six faces (front, back, left, right, top, and bottom) on bounding box 107 that encloses the input solid (e.g., input solid model 102). c) An alignment angle that specifies an angle that will be used to determine if a planar face 206 on the input solid (e.g., input solid model 102) is to be considered. d) The set of planar faces 206 on the input solid (e.g., input solid model 102). e) An intersection tolerance that will be used by conversion computing device 104 when determining if a given face 206 is an outer face of the input solid (e.g., input solid model 102). The inputs and the steps of process 900 that use the inputs are described in more detail below.

More specifically, conversion computing device 104 isolates 902 and identifies a reference face, such as reference face 1002, that will be used to find the nearest face 206 of input solid model 102. Next, conversion computing device 104 determines 904 which of the planar faces 206 (e.g., first face 402, second face 404, third face 406, fourth face 408, fifth face 410, sixth face 412, seventh face 414, eighth face 416, and ninth face 418) on input solid model 102 are within a specified angle ("alignment angle") 1012 of reference face 1002. Alignment angle 1012 defines an alignment cone 1004. For each planar face, for example face 1010, of input solid model 102, the angle 1009 is measured between a normal vector 1008 of the face 1010 and a normal vector 1006 of reference face 1002.

If the measured angle 1009 is less than, or equal to, the alignment angle 1012, then conversion computing device 104 identifies the face (e.g., face 1010) to determine if the face (e.g., face 910) is the closest face to the reference face 1002. This process enables conversion computing device 104 to filter out a majority of the faces (i.e., one or more of first face 402, second face 404, third face 406, fourth face 408, fifth face 410, sixth face 412, seventh face 414, eighth face 416, and ninth face 418) that should not be considered. Next, conversion computing device 104 sorts 906 the aligned faces (i.e., those faces that were not filtered out in the previous step), from nearest to farthest from reference face 1002. Starting with the nearest aligned planar face (e.g., one of first face 402, second face 404, third face 406, fourth face 408, fifth face 410, sixth face 412, seventh face 414, eighth face 416, and ninth face 418), conversion computing device 104 loops 908 through the faces 206 and determines which is the nearest bounding face (i.e., outer face) to reference face 1002. In each subsequent iteration of the loop, conversion computing device 104 removes the previously found near-face 206 and then finds the next nearest face 206. In the end, conversion computing device 104 has (i.e., stores in memory 310) a re-ordered set of the aligned faces 206 from nearest to farthest from the reference face 206.

Figure 11:
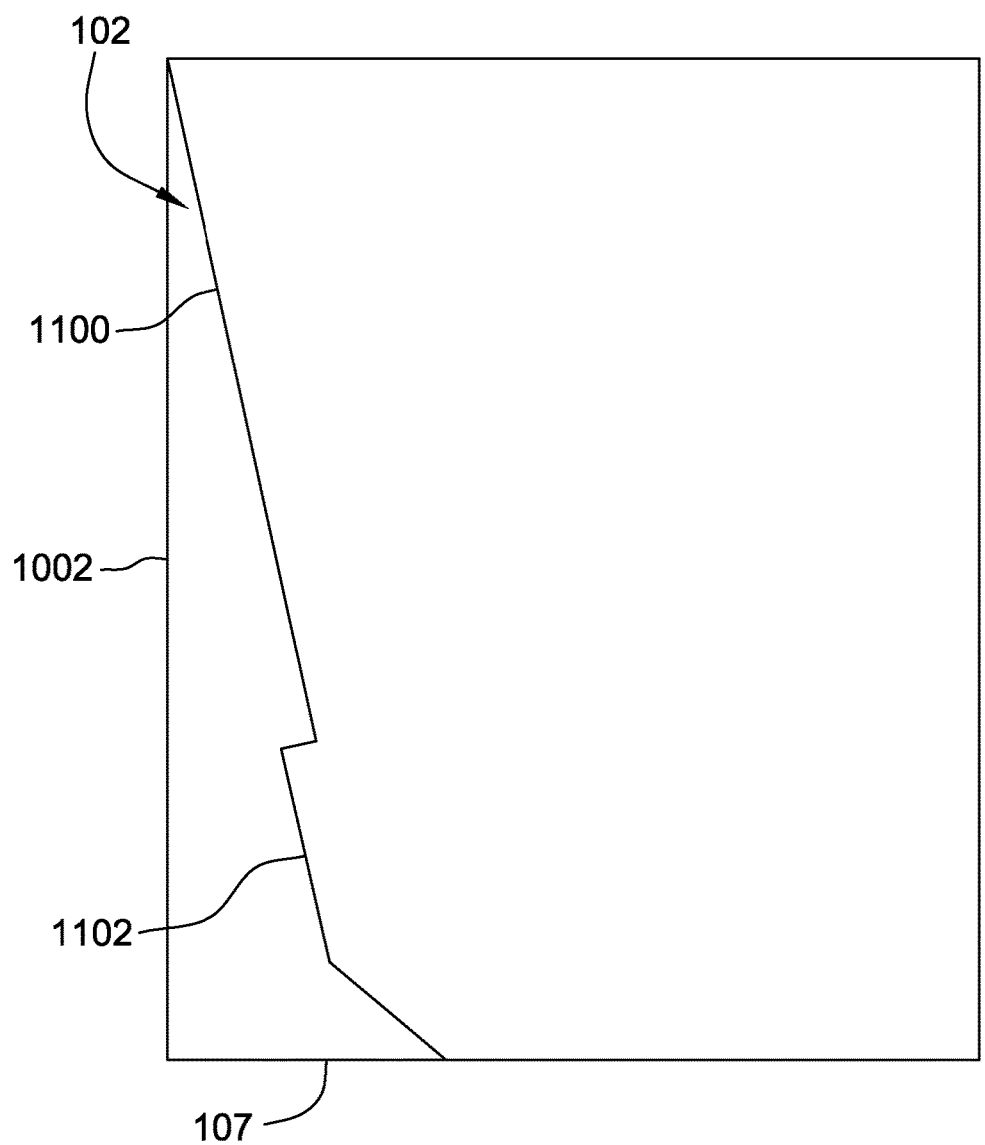
FIG. 11 is yet another diagram of the input solid model and the bounding box enclosing the input solid model, illustrating steps in the process shown in FIG. 9.

Next, conversion computing device 104 determines which face is an outer bounding face. More specifically, conversion computing device 104 creates 910 a set of offset planes (i.e., offset planes 704 and 706) in the positive and negative direction from the direction of the normal 218 of the face 206 determined to be nearest to reference face 1010. Next, conversion computing device 104 determines 912 whether both of the offset planes 704 and 706 intersect with input solid model 102. If both of the offset planes 704 and 706 intersect with input solid model 102, then conversion computing device 104 discards 914 the face 206 as it is not an outer bounding face on input solid model 102. However, if conversion computing device 104 determines that one of the offset planes (i.e., one of offset planes 704 and 706) does not intersect with input solid model 102, then conversion computing device 104 selects 916 the face 106 as the outer bounding face nearest to reference face 1002. For example, as shown in FIG. 11, while face 1100 (eighth face 416) is the nearest to reference face 1002, face 1102 (sixth face 412) is the nearest outer bounding face, as determined in the steps described above. In other words, and as described above, since face 1100 (eighth face 416) is an intersecting face 206, conversion computing device 104 discards face 1100 from consideration at step 914.

Figure 12:
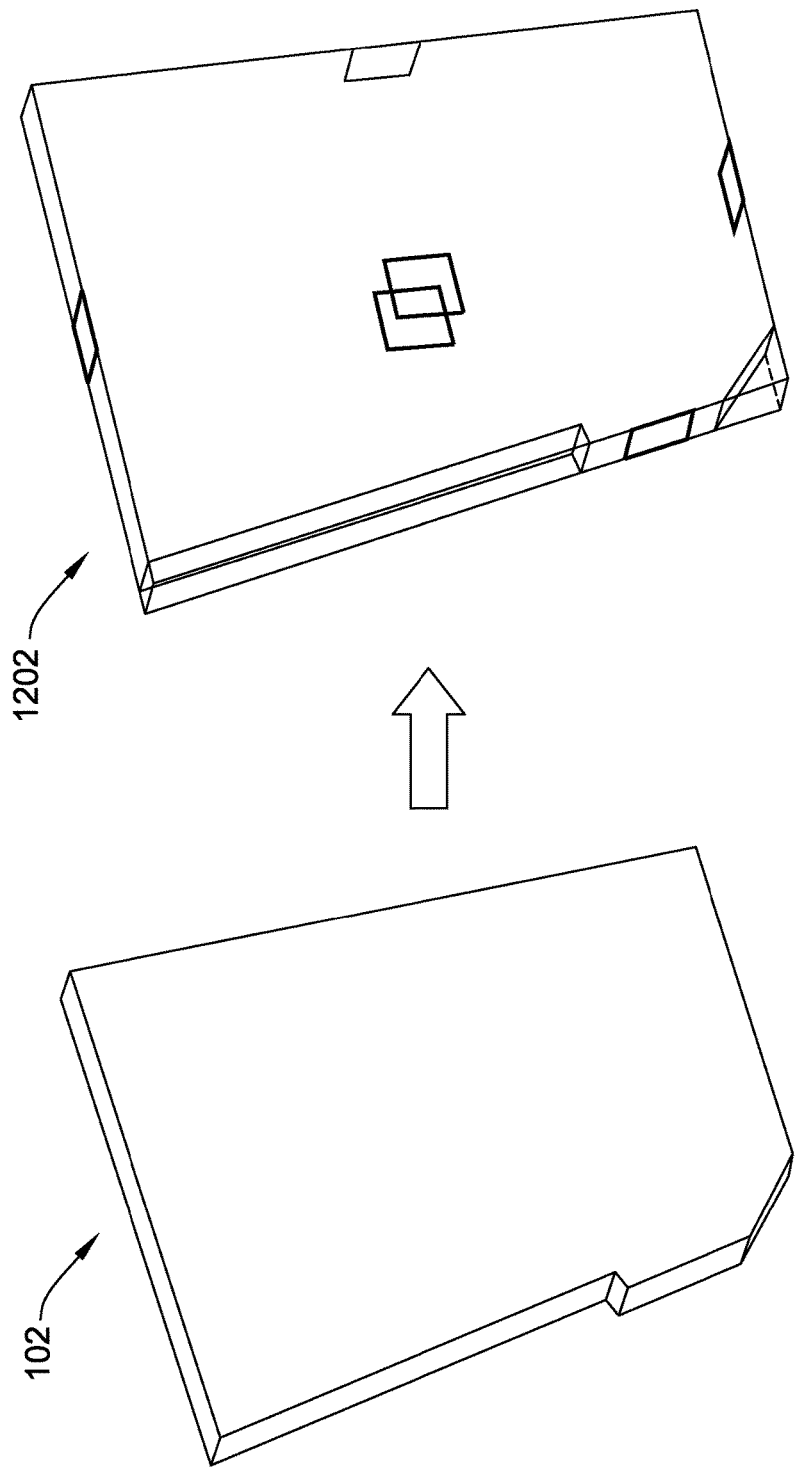
FIG. 12 is a diagram of the input solid model and a trimmed bounding box generated using the process shown in FIG. 9.

Conversion computing device 104 proceeds with steps similar to steps described in process 500. More specifically, conversion computing device 104 creates 918 an offset plane 214 on the selected face (e.g., face 1102). Conversion computing device 104 uses an offset of zero so that the resulting plane 214 lies on the planar face (e.g., face 1102). Conversion computing device 104 ensures that the direction of the normal of the new plane 214 is oriented such that the plane 214 will split the solid (e.g., bounding box 107) correctly. The plane 214 generated during this step is a bounding plane 106 shown in FIG. 1. Next, conversion computing device 104 uses 920 the plane 214 (e.g., bounding plane 106) created in the previous step to split the bounding box solid (e.g., bounding box 107). As a result, bounding box 107 is trimmed to the outer face 206 nearest to reference face 1002. FIG. 12 is a diagram of input solid model 102 and a trimmed bounding box 1202 generated using process 900. Trimmed bounding box 1202 is the output solid model 108 shown in FIG. 1. In at least some implementations, conversion computing device 104 performs the above steps for each reference face of bounding box 107.

Figure 13:
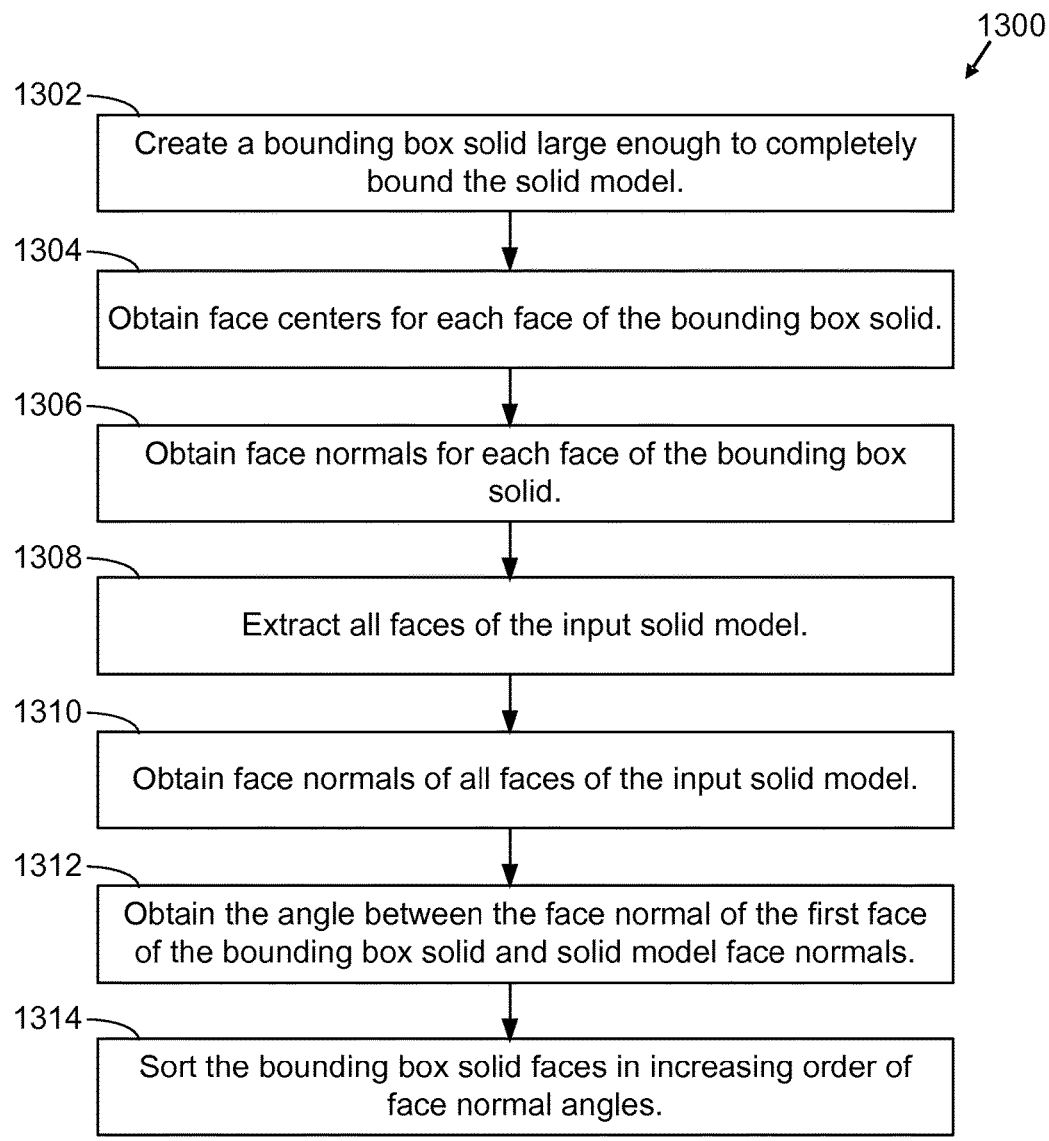
FIG. 13 is a flow chart of steps in a process performed by the conversion computing device shown in FIG. 1.
Figure 14:
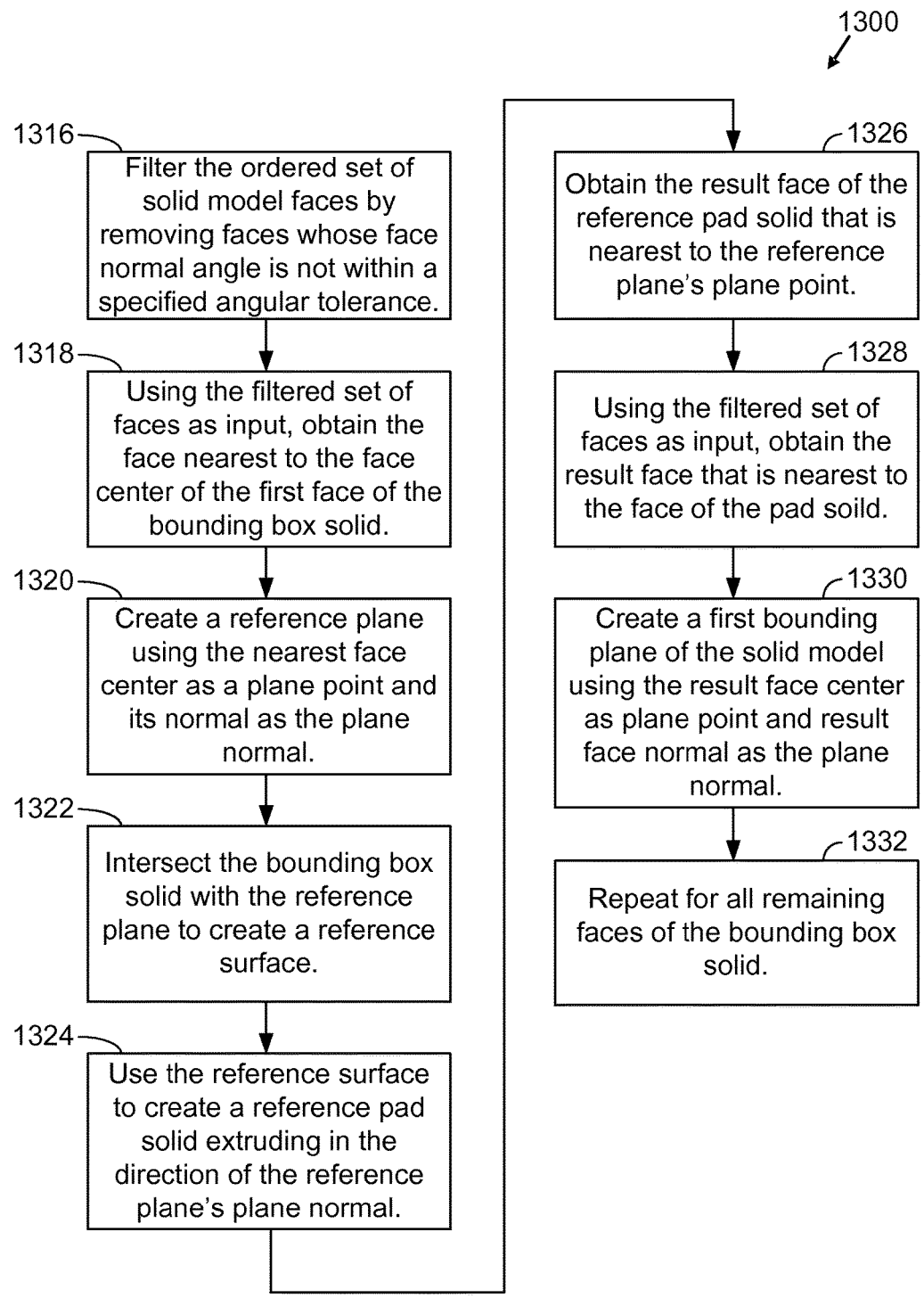
FIG. 14 is a continuation of the flow chart shown in FIG. 13, showing additional steps in the process performed by the conversion computing device.

FIG. 13 is a flow chart of steps in a process 1300 performed by conversion computing device 104. FIG. 14 is a flow chart of additional steps in process 1300. Initially, conversion computing device 104 creates 1302 a bounding box solid (e.g., bounding box 107) that is large enough to completely bound input solid model 102. Next, conversion computing device 104 obtains 1304 centers 212 of each face 206 of the bounding box solid (e.g., bounding box 107). Additionally, conversion computing device 104 obtains 1306 a normal 218 for each face 206 of the bounding box solid (e.g., bounding box 107). Next, conversion computing device 104 extracts 1308 all faces 206 of input solid model 102 (e.g., first face 402, second face 404, third face 406, fourth face 408, fifth face 410, sixth face 412, seventh face 414, eighth face 416, and ninth face 418). Next, conversion computing device 104 obtains 1310 normals 218 for all faces 206 of input solid model 102. Next, conversion computing device 104 obtains 1312 the angle between the normal 218 of the first face 206 of the bounding box solid (e.g., bounding box 107), and the solid model face normals (i.e., normals 218 of each of first face 402, second face 404, third face 406, fourth face 408, fifth face 410, sixth face 412, seventh face 414, eighth face 416, and ninth face 418 of input solid model 102). Accordingly, conversion computing device 104 obtains a measured angle, such as measured angle 1009, described with reference to FIG. 10.

Next, conversion computing device 104 sorts 1314 the faces 206 of the bounding box solid (e.g., bounding box 107) in increasing order of angles of the normals 218 of the faces 206. Next, conversion computing device 104 filters 1316 the ordered set of solid model faces 206 by removing faces 206 that have normal angles (e.g., measured angle 1009) that are not within a specified angular tolerance (e.g., alignment angle 1012). Next, using the filtered set of faces 206 as input, conversion computing device 104 obtains 1318 the face 206 (e.g., one of first face 402, second face 404, third face 406, fourth face 408, fifth face 410, sixth face 412, seventh face 414, eighth face 416, and ninth face 418) nearest to the center 212 of the first face 206 (e.g., reference face 902) of the bounding box solid (e.g., bounding box 107).

Next, conversion computing device 104 creates 1320 a reference plane 214 using the center 212 of the nearest face 206 as a point 216 from which to generate reference plane 214 and the normal 218 of the nearest face 206 as the normal 218 for the reference plane 214. Next, conversion computing device 104 intersects 1322 the bounding box solid (e.g., bounding box 107) with the reference plane 214 to create a reference surface (e.g., a face 206). Next, conversion computing device 104 uses 1324 the reference surface (e.g., a face 206) to create a reference pad solid (e.g., pad 204) extruding in the direction of the normal 218 of the reference plane 214. Next, conversion computing device 104 obtains 1326 a result face 206 of the reference pad solid (e.g., pad 204) that is nearest to a point 216 of the reference plane 214. Using the filtered set of faces 206 as input, conversion computing device 104 obtains 1328 the result face 206 that is nearest to the face of the reference pad solid (e.g., pad 204). Additionally, conversion computing device 104 creates 1330 a first bounding plane 106 of the solid model (e.g., input solid model 102) using the resulting face center 212 as a plane point 216 and a resulting face normal 218 as the normal 218 of the bounding plane 106. Conversion computing device 104 repeats 1332 steps 1312 through 1328 for all remaining faces 206 of the bounding box solid (e.g., bounding box 107).

Figure 15:
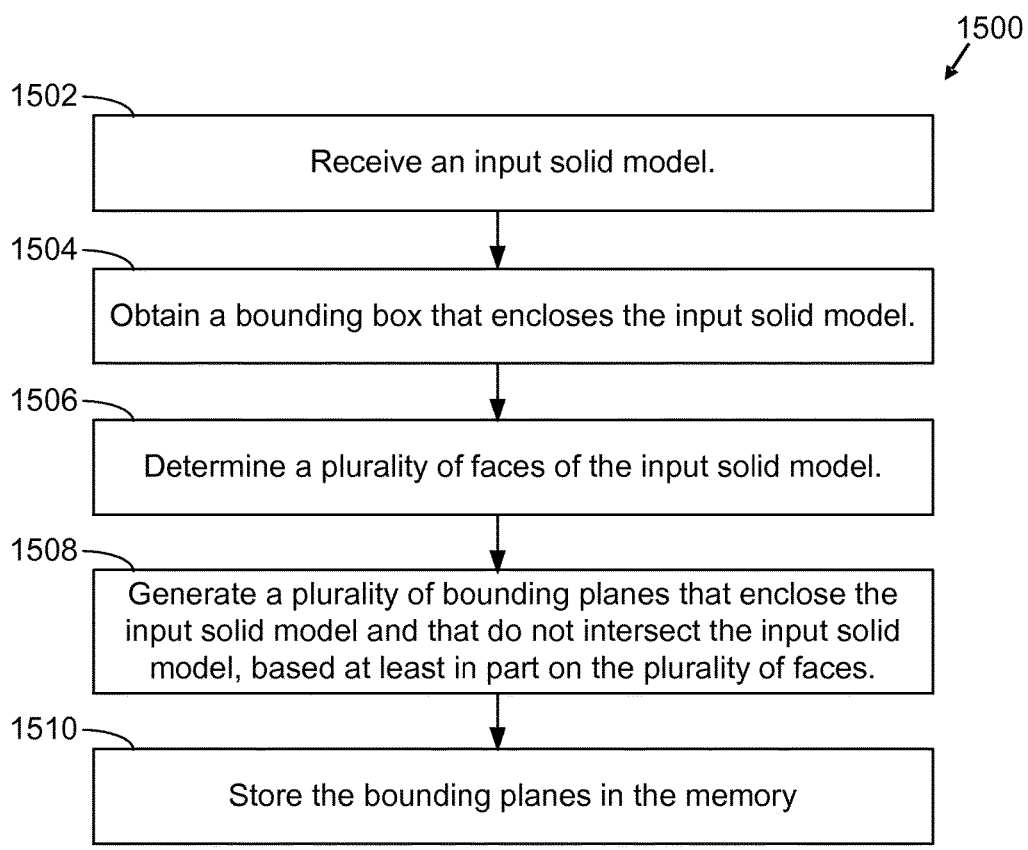
FIG. 15 is a flow chart of a process performed by the conversion computing device for generating bounding planes surrounding the input solid model shown in FIG. 1.

FIG. 15 is a flow chart of a process 1500 performed by conversion computing device 104 for generating bounding planes 106 surrounding input solid model 102. Initially, conversion computing device 104 receives 1502 an input solid model (e.g., input solid model 102). Additionally, conversion computing device 104 obtains 1504 a bounding box solid (e.g., bounding box 107) that encloses the input solid model (e.g., input solid model 102). Additionally, conversion computing device 104 determines 1506 a plurality of faces (e.g., faces 206) of the input solid model (e.g., input solid model 102). Additionally, conversion computing device 104 generates 1508 a plurality of bounding planes (e.g., bounding planes 106) that enclose the input solid model (e.g., input solid model 102) and that do not intersect the input solid model (e.g., input solid model 102), based at least in part on the plurality of faces (e.g., faces 206). Additionally, conversion computing device 104 stores 1510 the bounding planes (e.g., bounding planes 106) in memory (e.g., memory 310).

A technical effect of systems and methods described herein includes at least one of: (a) receiving, by a conversion computing device, an input solid model; (b) obtaining, by the conversion computing device, a bounding box solid that encloses the input solid model; (c) determining, by the conversion computing device, a plurality of faces of the input solid model; (d) generating, by the conversion computing device, a plurality of bounding planes that enclose the input solid model and that do not intersect the input solid model, based at least in part on the plurality of faces; and (e) storing, by the conversion computing device, the bounding planes in a memory.

As compared to known methods and systems for manipulating solid models for use in computer aided design (CAD), the methods and systems described herein facilitate migrating an input solid model from a first CAD system to a second CAD system such that bounding planes are generated for the input solid model and used in the second CAD system. Accordingly, users of the second CAD system may use bounding plane information for the input solid model that would otherwise be unavailable. The bounding plane information is useful in clash detection, among other applications.

The description of the different advantageous implementations has been presented for purposes of illustration and description, and is not intended to be exhaustive or limited to the implementations in the form disclosed. Many modifications and variations will be apparent to those of ordinary skill in the art. Further, different advantageous implementations may provide different advantages as compared to other advantageous implementations. The implementation or implementations selected are chosen and described in order to best explain the principles of the implementations, the practical application, and to enable others of ordinary skill in the art to understand the disclosure for various implementations with various modifications as are suited to the particular use contemplated. This written description uses examples to disclose various implementations, which include the best mode, to enable any person skilled in the art to practice those implementations, including making and using any devices or systems and performing any incorporated methods. The patentable scope is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A method for generating bounding planes surrounding a solid model, said method is implemented by a conversion computing device including a processor coupled to a memory, said method comprising:
   receiving, by the conversion computing device, an input solid model;
   obtaining, by the conversion computing device, a bounding box solid that encloses the input solid model, wherein the bounding box solid is sized such that at least a portion of an interior volume of the bounding box solid is unoccupied by the input solid model;
   determining, by the conversion computing device, a plurality of faces of the input solid model;
   generating, by the conversion computing device, a plurality of bounding planes that enclose the input solid model and that do not intersect the input solid model, based at least in part on the plurality of faces;
   determining that a selected face of the input solid model is nearer to a reference face of the bounding box solid than the other faces;
   creating a reference plane using a center of the selected face and a normal of the selected face;
   intersecting the bounding box solid with the reference plane to create a reference surface;
   creating a reference pad solid extruding in the direction of the normal;
   obtaining a result face of the reference pad solid that is nearest to the center of the selected face;
   generating at least one of the bounding planes based on the result face; and
   storing, by the conversion computing device, the bounding planes in the memory.

2. The method of claim 1, further comprising generating an output file that includes a solid model having a plurality of the generated bounding planes.

3. The method of claim 1, further comprising generating an output file that includes a solid model by splitting the bounding box solid based on the bounding planes such that at least a portion of the bounding box solid is removed to define the solid model from the bounding box solid.

4. The method of claim 1, further comprising:
   generating a first offset plane and a second offset plane for a selected one of the plurality of faces;
   determining that at least on one of the first offset plane and the second offset plane does not intersect the input solid model; and
   in response to determining that at least one of the first offset plane and the second offset plane does not intersect the input solid model, identifying the selected one of the plurality of faces as a bounding face.

5. The method of claim 1, further comprising:
generating a first offset plane and a second offset plane for a selected one of the plurality of faces;
determining that both of the first offset plane and the second offset plane intersect the input solid model; and
in response to determining that both the first offset plane and the second offset plane intersect the input solid model, identifying the selected one of the plurality of faces as not a bounding face.

6. The method of claim 1, further comprising generating the plurality of bounding planes by generating a plurality of offset planes having an offset of zero from corresponding bounding faces of the input solid model.

7. The method of claim 1, further comprising determining an angle between a first normal of at least one of the plurality of faces and a second normal of a reference face of the bounding box solid.

8. The method of claim 1, further comprising determining that a selected face of the input solid model is nearer to a reference face of the bounding box solid than the other faces.

9. The method of claim 1, further comprising sorting each of the plurality of faces of the input solid model based on respective angles between a first respective normal of each of the plurality of faces and a second normal of a reference face of the bounding box solid.

10. The method of claim 1, further comprising filtering the plurality of faces based on the respective angles.

11. A conversion computing device for use in generating bounding planes surrounding a solid model, said conversion computing device comprising a processor coupled to a memory, said processor configured to:
receive an input solid model;
obtain a bounding box solid that encloses the input solid model, wherein the bounding box solid is sized such that at least a portion of an interior volume of the bounding box solid is unoccupied by the input solid model;
determine a plurality of faces of the input solid model;
generate a plurality of bounding planes that enclose the input solid model and that do not intersect the input solid model, based at least in part on the plurality of faces;
determine that a selected face of the input solid model is nearer to a reference face of the bounding box solid than the other faces;
create a reference plane using a center of the selected face and a normal of the selected face;
intersect the bounding box solid with the reference plane to create a reference surface;
create a reference pad solid extruding in the direction of the normal;
obtain a result face of the reference pad solid that is nearest to the center of the selected face;
generate at least one of the bounding planes based on the result face; and
store the bounding planes in the memory.

12. The conversion computing device of claim 11, further configured to generate an output file that includes a solid model based on the bounding planes.

13. The conversion computing device of claim 11, further configured to generate an output file that includes the solid model by splitting the bounding box solid based on the bounding planes.

14. The conversion computing device of claim 11, further configured to:
generate a first offset plane and a second offset plane for a selected one of the plurality of faces;
determine that at least on one of the first offset plane and the second offset plane does not intersect the input solid model; and
in response to determining that at least one of the first offset plane and the second offset plane does not intersect the input solid model, identify the selected one of the plurality of faces as a bounding face.

15. The conversion computing device of claim 11, further configured to:
generate a first offset plane and a second offset plane for a selected one of the plurality of faces;
determine that both of the first offset plane and the second offset plane intersect the input solid model; and
in response to determining that both the first offset plane and the second offset plane intersect the input solid model, identify the selected one of the plurality of faces as not a bounding face.

16. The conversion computing device of claim 11, further configured to generate the plurality of bounding planes by generating a plurality of offset planes having an offset of zero from corresponding bounding faces of the input solid model.

17. The conversion computing device of claim 11, further configured to determine an angle between a first normal of at least one of the plurality of faces and a second normal of a reference face of the bounding box solid.

18. The conversion computing device of claim 11, further configured to determine that a selected face of the input solid model is nearer to a reference face of the bounding box solid than the other faces.

19. A non-transitory computer-readable storage medium having computer-executable instructions embodied thereon for use in generating bounding planes surrounding a solid model, wherein when executed by a conversion computing device including a processor coupled to a memory, the computer-executable instructions cause the conversion computing device to:
receive an input solid model;
obtain a bounding box solid that encloses the input solid model, wherein the bounding box solid is sized such that at least a portion of an interior volume of the bounding box solid is unoccupied by the input solid model;
determine a plurality of faces of the input solid model;
generate a plurality of bounding planes that enclose the input solid model and that do not intersect the input solid model, based at least in part on the plurality of faces;
determine that a selected face of the input solid model is nearer to a reference face of the bounding box solid than the other faces;
create a reference plane using a center of the selected face and a normal of the selected face;
intersect the bounding box solid with the reference plane to create a reference surface;
create a reference pad solid extruding in the direction of the normal;
obtain a result face of the reference pad solid that is nearest to the center of the selected face;
generate at least one of the bounding planes based on the result face; and
store the bounding planes in the memory.

* * * * *